United States Patent [19]

Das et al.

[11] Patent Number: 5,221,422

[45] Date of Patent: Jun. 22, 1993

[54] LITHOGRAPHIC TECHNIQUE USING LASER SCANNING FOR FABRICATION OF ELECTRONIC COMPONENTS AND THE LIKE

[75] Inventors: Shyam C. Das, Sudbury; Jamaluddin Khan, Shrewsbury, both of Mass.

[73] Assignee: Digital Equipment Corporation, Maynard, Mass.

[21] Appl. No.: 369,714

[22] Filed: Jun. 22, 1989

Related U.S. Application Data

[63] Continuation-in-part of Ser. No. 205,490, Jun. 6, 1988, Pat. No. 4,877,480.

[51] Int. Cl.$^5$ .......................................... H01L 21/00
[52] U.S. Cl. .............................. 156/643; 156/651; 156/659.1; 156/635; 156/637
[58] Field of Search ............... 156/643, 656, 650, 651, 156/652, 659.1, 635, 637, 659.1

[56] References Cited

U.S. PATENT DOCUMENTS

| | | | |
|---|---|---|---|
| 3,991,296 | 11/1976 | Kojima et al. | 219/121 |
| 4,108,659 | 8/1978 | Dini | 96/36.3 |
| 4,139,409 | 2/1979 | MacKep et al. | 156/643 |
| 4,300,177 | 11/1981 | Koel et al. | 360/113 |
| 4,328,410 | 5/1982 | Slivinsky et al. | 219/121 |
| 4,379,022 | 4/1983 | Melcher et al. | 156/643 |
| 4,389,275 | 6/1983 | Ballato | 156/643 |
| 4,443,493 | 4/1984 | Delfino | 427/53.1 |
| 4,603,089 | 7/1986 | Bampton | 428/593 |
| 4,644,130 | 2/1987 | Bachmann | 219/121 |
| 4,786,358 | 11/1988 | Yamazaki et al. | 156/643 |
| 4,877,480 | 10/1989 | Das | 156/643 |

FOREIGN PATENT DOCUMENTS

| | | |
|---|---|---|
| 0054315 | 12/1981 | European Pat. Off. |
| 0256938 | 8/1987 | European Pat. Off. |
| 87401844.3 | 2/1988 | European Pat. Off. |
| 2297143 | 8/1976 | France |
| 55-82780 | 6/1980 | Japan |
| 57-100620 | 6/1982 | Japan |
| 59-104287 | 6/1984 | Japan |
| 60-92093 | 5/1985 | Japan |
| 60-98511 | 6/1985 | Japan |
| 60-229283 | 11/1985 | Japan |
| 60-254406 | 12/1985 | Japan |
| 61-30672 | 2/1986 | Japan |
| 61-76689 | 4/1986 | Japan |
| 61-95792 | 5/1986 | Japan |
| 59-216126 | 5/1986 | Japan |
| 61-188713 | 8/1986 | Japan |
| 61-276108 | 12/1986 | Japan |
| 62-254427 | 11/1987 | Japan |
| 63-175822 | 7/1988 | Japan |

OTHER PUBLICATIONS

Srinivasan et al., Appl. Phys. Lett 41:576-578, 1982.
von Gutfeld et al., Appl. Phys. Lett. 40:352-354, 1982.
von Gutfeld et al., Appl. Phys. Lett. 35:651-653, 1979.
Cohen et al., The Bell System Technical Journal, 384-405, 1968.
Anderson et al., IBM Technical Disclosure Bulletin, 26:5039, 1984.
Hodgson et al., IBM Technical Disclosure Bulletin, 25:6395, 1983.
Electronics International, 55:48, 1982.
Cohen, Bell Laboratories Record, 247-251, 1967.
Gagliano et al., Proc. of IEEE, 114-147, 1969.

Primary Examiner—Brian E. Hearn
Assistant Examiner—George Goudreau
Attorney, Agent, or Firm—Fish & Richardson

[57] ABSTRACT

A microlithographic process of fabricating electronic components, such as, for example, integrated circuit chips and thin film read/write heads for computer disk systems, in which a laser is used to etch features defined by a mask. The laser is selected whose radiation will be absorbed by the workpiece being etched, and the masking material is selected so as to be highly reflective of the laser radiation. The masking material is patterned in a conventional manner so as to expose the portions of the workpiece material to be etched. When the laser is directed to the workpiece, the laser radiation etches the portions of the workpiece not protected by the mask. A preferred process of scanning with a laser is disclosed. Etching may be improved if performed under a liquid transparent to the laser radiation.

20 Claims, 2 Drawing Sheets

LITHOGRAPHIC TECHNIQUE USING LASER SCANNING FOR FABRICATION OF ELECTRONIC COMPONENTS AND THE LIKE This application is a continuation-in-part of copending application Ser. No. 07/205,490, filed Jun. 6, 1988, Pat. No. 4,877,480 issued Oct. 31, 1989, assigned to a common assignee.

BACKGROUND OF THE INVENTION

1. Field of the Invention

The invention relates generally to the field of lithographic processing techniques and more specifically to techniques using lasers for fabrication of electronic devices using lithography. The inventive laser techniques are particularly useful in fabricating such components as thin-film magnetic read/write heads for magnetic storage devices for digital data processing systems.

2. Description of the Prior Art

Microlithographic techniques have been advantageously used for a number of years in the fabrication of a number of types of electronic equipment. Such techniques are used, for example, in semiconductor processing, and more recently have been applied to the manufacture of read/write heads used in disk mass data storage units.

In microlithograph fabrication of electronic components, a workpiece, such as a substrate in the case of semiconductor processing, is first formed. Lithographic techniques are then used to form the various circuit and other features in the workpiece. In such techniques, various layers of material are deposited and the features are outlined therein by means of a photoresistive material ("photoresist") that is applied and patterned in a well-known manner. After the photoresist is patterned, portions of the workpiece or selected layers under the regions not covered by the masks are removed by chemical or ion beam etching. This procedure is typically repeated a number of times to form the final device.

A number of problems arise, however, in both chemical and ion beam etching. In chemical etching, the chemicals that are used to perform the etch not only remove the unprotected material from the unmasked areas, they also tend to undercut, at least slightly, the portions of the workpiece directly under the edges of the masked areas. This occurs because, as the etching chemicals remove the unmasked material, the sidewalls of the regions directly under the masks are exposed to the chemicals, which also are etched. This undercutting limits the size of the features that can be formed in the device. In particular, in designing a device, the designer must take into account the degree of undercutting that would be expected during device fabrication when he is determining how close features can be and the minimum widths of the features.

With ion beam etching, the ion beam which performs the etch is unidirectional. Accordingly, if the ion beam is directed perpendicular to the surface of the workpiece, undercutting does not occur. However, current ion beam etching techniques use a broad ion beam which is applied to the entire workpiece, rather than to a specific portion of the workpiece. As a result, the ion beam not only removes material that is not masked, it also cuts into at least the masking material itself. Accordingly, care must be taken to ensure that the masks are thick enough so that all of the unmasked material that is to be removed is in fact removed before the mask itself is completely etched away. The mask cannot be arbitrarily thin; it must be at least thick enough so that it is not etched away before the portions of the underlying layer to be etched have been etched to the required depth. Furthermore, if the mask is too thick, it will limit the minimum feature size on the workpiece.

Another problem with ion beam etching techniques is that they use energetic particles, such as atoms or ions which are applied to the entire workpiece. When the entire workpiece is so exposed to the energetic particles, it experiences a temperature increase and heat build-up which is undesirable for such devices as the magnetic read/write heads. Furthermore, with ion beam etching, often some small amount of the material initially removed from the workpiece is redeposited elsewhere on the workpiece, which can limit the feature resolution size possible with the technique, and can also interfere with proper operation of the device in some circumstances.

Heretofore, lasers have also been used to etch certain difficult to etch workpiece materials such as ceramics and certain polymers, and also in trimming such circuit elements as thin film resistors. In the existing laser techniques, the laser beam is focused to a tiny spot, which is directed onto the surface of a workpiece. The spot is moved over the surface of the workpiece to remove the unwanted material. This eliminates the need for masking, but it has at least several drawbacks. For example, in laser etching the size of the spot is a lower bound on the size of the features that can be formed in the workpiece, and so for a very small or arbitrarily-shaped feature sophisticated optical elements would be needed. Furthermore, since in the conventional laser technique only one feature is formed at a time, more time would be required than if the laser could operate on the entire surface of the workpiece at one time.

With all three techniques, it is also difficult, once etching begins, to stop the etch to ensure that recesses are formed which have predetermined depths that are fairly precisely defined. The depth of an etched recess varies not only with the time the etch is applied, but also with the characteristics of the materials being etched, and as between various production runs even of nominally the same materials, variations in the materials will result in variations in the depths of the recesses.

SUMMARY OF THE INVENTION

The invention provides a new and improved laser lithographic technique for etching a workpiece. In the new technique, a mask of a material that is highly reflective in the wavelengths of the laser to be used is placed on the surface of the workpiece by conventional techniques. The laser radiation is then applied to the masked surface of the workpiece to remove unmasked workpiece material. Etching may be performed with the workpiece in a liquid bath transparent to the laser radiation. For improved performance the liquid layer can be methylene chloride, potassium hydroxide, or dilute nitric acid with small amounts of potassium dichromate.

In one aspect a laser scanning protocol includes exposing the surface of the material thru a reflective mask layer with a pattern of laser radiation such that material is removed from the workpiece to leave a pattern in the remaining material corresponding to the openings in the reflective mask layer, the laser radiation being applied in a plurality of overlapping irradiations (pulses) to complete a full scan across the workpiece. Preferably each scan is performed about 20 times. After this set of scans, each next set of scans is applied to overlap with the prior set. Preferable overlap is about one-third of beam dimension. Each scan can be performed in a straight line excursion between the outer dimensions of the workpiece at the location being scanned. The laser can be pulsed, preferably at around 4–5 hertz, having about 5 joules per pulse, and fluence at about 5.5 j/cm$^2$, the workpiece being moved at about 0.6 cm/sec.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 1, comprising

DETAILED DESCRIPTION OF THE PREFERRED AND ILLUSTRATIVE EMBODIMENTS

Figure 1A:
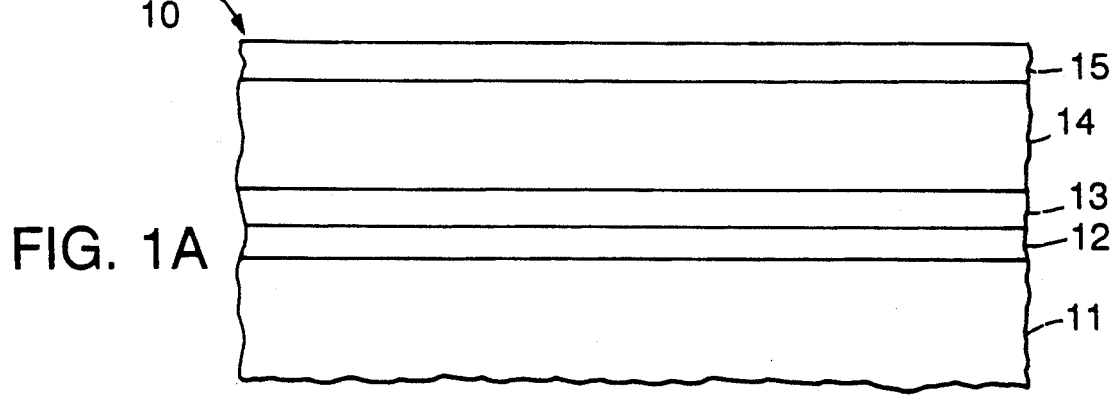
FIGS. 1A through 1C, depict the new laser lithography technique in accordance with the invention.

With reference to the Figures, FIG. 1A depicts a workpiece 10 which ma be used in connection with the new laser lithographic technique. The workpiece includes a substrate 11 on which prior processing may have been performed before the laser processing technique described herein has begun. In the workpiece 10 depicted on FIG. 1, prior processing has been performed to deposit a layer 12 on top of substrate 11. In addition, in previous processing, various features and electronic circuit elements which are not specifically shown in FIG. 1 may have been formed in substrate 11 and layer 12 by means of conventional processes which form no part of the invention.

Figure 1B:
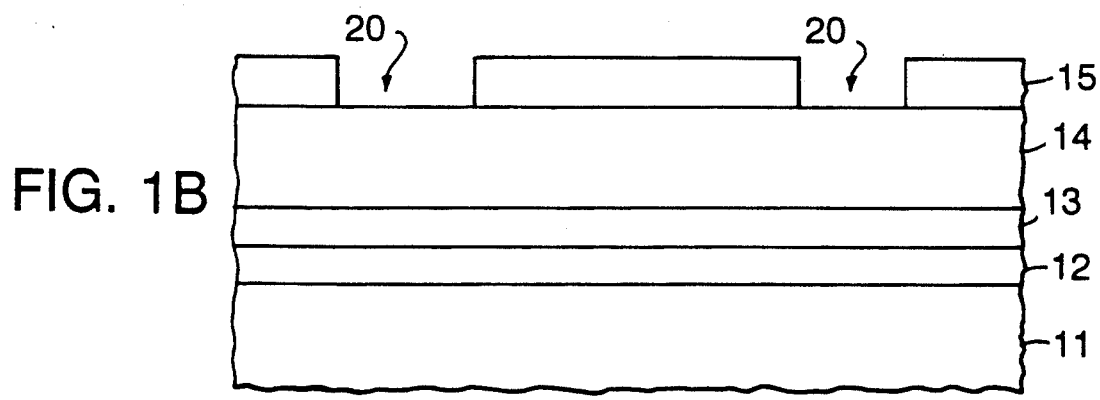

In accordance with the invention, a layer 13 is initially deposited on the layer 12, a third layer 14 in which a recess is to be formed by means of laser radiation (represented by downwardly-going arrows 16) is then deposited on layer 13, and a top layer 15 is then formed over layer 14. Layer 15 is patterned to form openings 20 (FIG. 1B) in the layer, which serves to expose portions of underlying layer 14. The layer 15 can be patterned by, for example, conventional photolithographic techniques using chemical or ion beam etch procedures. The openings 20 are provided to define the sidewall boundaries of the recesses which are to be formed in underlying layer 14. Two such openings 20 are depicted in FIG. 1B. The openings may be of any arbitrary shape.

Figure 1C:
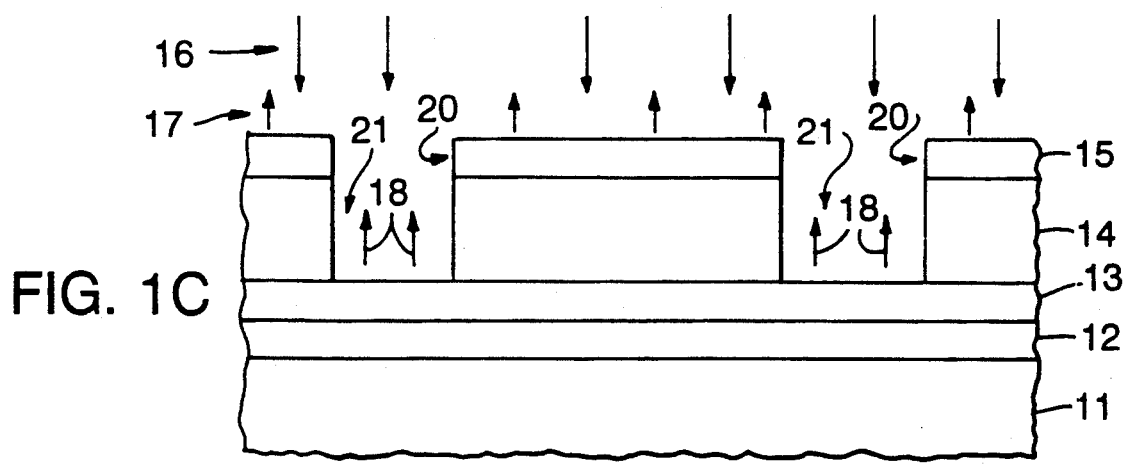

The laser which will be used is selected so that the materials which comprise layers 13 and 15 are highly reflective at the wavelength of the laser radiation. The material which comprises layer 14 is selected to have low reflectivity, and also low transmissivity, at the wavelength of the laser radiation. As shown in FIG. 1C, since layer 15 is highly reflective at the wavelengths of the incident laser radiation 16, layer 15 reflects laser radiation as represented by arrows 17 and thus is not effected by the radiation. However, layer 14 does not reflect the radiation, and thus the regions exposed by openings 20 absorb the radiation and are effectively vaporized thereby and thus removed to form recesses 21. The removal of the exposed portions of layer 14 continues until the underlying portions of reflective layer 13 are exposed. Layer 13, like layer 15, reflects the laser radiation, as represented by arrows 18, and is also unaffected thereby.

Thus, the pattern of layer 15 determines the shape (as viewed from a direction orthogonal to the exposed surface of layer 15) of the recess in layer 14, and layer 13 effectively serves to determine the maximum depth of the recess in the workpiece by preventing laser radiation from impinging on layer 12. Accordingly, it is apparent that the recess will not extend into layer 12 or substrate 11.

While the pattern of layer 15 has been described as being formed in situ, that is, while layer 15 has been in place on the workpiece, it will be appreciated by those skilled in the art that layer 15 may comprise a mask which has been patterned prior to being placed on layer 14.

It will be appreciated that in certain circumstances it may be undesirable for the etch-stop layer 13 to extend throughout the entire workpiece 10. For example, if copper is selected as the layer 13, and if layer 13 extends throughout the workpiece, the copper would act as an electrical conductor throughout the entire workpiece. If the workpiece is to have electrical connections through the openings 21 in layer 14, it would clearly be undesirable for layer 13 to extend to all of the openings. Thus, it may be necessary to also pattern etch-stop layer 13 so that the layer effectively complements the openings in layer 15. This would suffice to eliminate electrical conduction paths through layer 13 between the openings 21.

The materials selected for layers 13, 14 and 15 depend upon the laser to be used in the process, or alternatively, the laser selected for use in the process depends on the types of materials which may be required for the workpiece. In one particular example, the substrate 11 may comprise a high density ceramic substrate having about seventy percent alumina ($Al_2O_3$) and thirty percent titanium carbide, and layer 12 may comprise alumina, and it is desired to produce a recess in a layer 14 also comprised of alumina.

Continuing with the aforementioned example, a carbon dioxide ($Co_2$) laser may effectively be used since the absorption by alumina of the carbon dioxide laser radiation is very high; that is, the alumina comprising layer 14 readily absorbs radiation in the wavelengths emitted by the carbon dioxide laser, and thus the exposed areas of layer 14 will effectively be evaporated by the laser. Suitable material for layers 13 and 15 in that example are copper and gold, both of which reflect on the order of ninety-eight percent of radiation in the wavelengths produced by carbon dioxide lasers. In one particular example, layer 13 may be gold and layer 15 may be copper, with both materials being deposited on the respective underlying layers by means of sputtering, and with the copper layer 15 being easily patterned by means of ion beam or chemical etching techniques.

It will be appreciated that this method provides a number of benefits over conventional etching methods. In particular, the laser etching typically removes unwanted material much faster than can be achieved by means of chemical etching techniques and with none of the undercutting problems that are present. The new laser technique may cause some minor deformations due to thermal energy being conducted in the vicinity of the openings in the workpiece outside of the region being removed, and further to resolidification of some of the melted material, but these can be minimized as explained below.

The new laser etching technique does not rely on differential etch rates between the masking material and the material to be etched, as do ion beam etching techniques. Accordingly, the minimum thickness of the mask used in the laser technique is not related to the thickness of the recess to be etched, as is the case in connection with ion beam techniques. The reflective layers used in the laser etching technique must be of sufficient thickness to be reflective over the surface of the workpiece in the areas not to be etched.

Furthermore, the new laser etching technique does not require focusing of the laser beam to a small spot and moving it over the surface of the workpiece to define the required features, as is necessary in present laser etching techniques. Thus, the sophisticated optical system characteristic of present laser techniques are not required in the new technique. In addition, the minimum feature size is not related to the size of the laser spot, and the workpiece can be processed at one time since the new technique allows the entire surface of the workpiece to be processed at one time, for a reasonably small workpiece.

As has been noted, recesses formed by the new laser lithographic technique may be slightly deformed due to heating of the workpiece outside the region being removed, and also due to resolidification of material which was heated by the laser but not evaporated, which could limit the resolution of the work. In addition, some metal and ceramic materials may deform and some ceramic materials may crack under intense laser radiation. However, these problems can be minimized by immersing the workpiece in a liquid, or providing a layer of liquid over the irradiated surface of the workpiece, while the laser is irradiating the surface. The liquid can act both to cool the workpiece and, depending on the nature of the liquid, may also either dissolve, by chemical action, or flush away, by mechanical action, debris that is thrown up from the workpiece while the laser is entrained thereon.

As will be appreciated by one skilled in the art, the selection of a suitable liquid will depend on a number of factors. In particular, a suitable liquid should be fairly transparent to the laser radiation and should not react with the masking material (that is, layers 13 and 15 in FIG. 1). It is also preferable that, if the liquid reacts with the material being etched (that is, layer 14 in FIG. 1) at all, it should react only very slowly at room temperature, so that the workpiece itself not be etched by the liquid outside of the area on which the laser beam is impinging.

If the liquid reacts with the material to be etched at elevated temperatures, which would be present at the areas illuminated by the laser radiation, it may assist the etch operation, effectively performing a chemical etch on the material in the area being struck by the laser. Since the temperature of the portions of the material that do not directly receive laser radiation will not be increased as much as the portions that do, they will not be etched as much by the liquid. The resulting etch by the liquid, which is effectively a chemical etch, would be more anisotropic than is a conventional chemical etch.

EXAMPLES

Example No. 1

Etching of Alumina by $CO_2$ Laser

An alumina layer was formed on a substrate, and a 200 Angstrom layer of chromium was deposited by sputtering. The chromium layer was provided to act as an adhesion layer for the next layer, which was gold (alternatively, copper could have been used). The gold layer, which served as layer 13 (FIG. 1) was one-half micron thick. A sheet of alumina approximately thirty to forty microns thick was then deposited by sputtering to form layer 14, and a three-tenths to five-tenths micron thick layer of copper (alternatively gold could have been used) was sputtered as layer 15.

The copper layer (15) was then patterned by conventional photolithographic techniques. In one case, a layer of photoresist was deposited on top of the copper layer and patterned in a conventional manner exposing a pattern of the copper layer underneath. The exposed copper was etched by an ion beam etch and any photoresist was dissolved in a developer. This leaves the openings (20, FIG. 1) exposing alumina in layer 14.

In another case, the copper layer 15 was patterned using a conventional lift-off technique. In that technique, the photoresist layer was deposited before the copper layer (the photoresist layer is not shown in FIG. 1) and a pattern in the photoresist was exposed in a conventional photolithography step. A thin copper layer was then sputter deposited on top of the workpiece including the photoresist, and then the patterned photoresist was dissolved in a developer. The dissolving photoresist took with it the copper directly on top of it, leaving the copper in the desired pattern.

After the copper layer 15 was patterned, the workpiece was covered by a thin film of methylene chloride liquid and irradiated using a pulsed carbon dioxide laser to etch the exposed alumina. The energy supplied by the laser was about four joules per laser pulse at four to ten pulses per second over an area of approximately one-fourth square inch.

Example No. 2

Etching Using A Removable Mask

In this example, the mask comprising layer 15 was not deposited onto the workpiece, but instead was formed separately and placed onto the surface of the workpiece to be etched. A workpiece was formed of alumina. A base mask was formed of generally planar nickel, with openings through which the workpiece could be exposed. The mask had a thickness of about fifteen microns in the areas adjacent the openings, and elsewhere a thickness of about 125 microns, the thick portion providing mechanical sturdiness while the thin portion allowed for better resolution in alignment of the mask over the workpiece. To prevent chemical interaction between the mask and a liquid which might be used, the mask was plated with a ten micron layer of gold. The mask was then aligned with the workpiece and both were clamped together in a fixture. Methylene chloride liquid was then sprayed onto the fixture to form a uniform thin layer on the surface which would receive the laser radiation.

The workpiece was then illuminated by a $CO_2$ laser. To increase the energy per unit area of the laser (which had about four joules per pulse), the laser beam was focused to a size of about one-fourth inch by one inch by means of lenses, and the workpiece was moved under the laser beam at a rate of six-thousandths of an inch per second until the entire surface of the workpiece had been exposed through the mask. The process was repeated twenty times to form recesses in the alumina having a depth of approximately thirty-five microns.

After the process was concluded, the mask was removed from the workpiece by unclamping the fixture. The mask could be used in a subsequent etching process.

Example No. 3

Etching of High-Density Ceramic

A workpiece was fabricated of high-density ceramic having a patterned layer of copper to define the pattern to be etched. Carbon dioxide, ruby and Nd:YAG lasers were used to perform the etch. When the etch was performed in air, that is, when no liquid was present, small cracks developed in the ceramic and some ceramic debris from the etch resolidified.

In other trials using high-density ceramic, several liquids were used, including methylene chloride and a solution of potassium hydroxide in water. The potassium hydroxide solution was generally satisfactory for the Nd:YAG and ruby lasers, even though for some depths of liquid it absorbed about thirty-five percent of the radiation of the Nd:YAG laser. The preferred concentration of the potassium hydroxide was on the order of twelve normal (12 N) or above; trial etches in solutions having concentrations of on the order of six normal or less exhibited some cracking of the ceramic.

Example No. 4

Etching of Permalloy

A workpiece was prepared comprising an Alsimag substrate on which a three thousand Angstrom thick layer of aluminum was deposited by sputtering. The aluminum served as a etch-stop layer. A two thousand Angstrom thick layer of permalloy was then plated onto the aluminum sheet. An aluminum mask was formed on the permalloy layer using a lift-off technique. The workpiece was then irradiated, in air, with a krypton fluoride laser. The permalloy was etched without affecting the aluminum mask or the etch-stop layer.

In another trial, a solution of dilute nitric acid with small amounts of potassium dichromate was used. The resulting etch had less resolidification of molten permalloy than had occurred in the etch without the liquid.

Example No. 5

Etching of Polymer

A thin film of copper was deposited on a silicon substrate as an etch-stop layer (13, FIG. 1). A layer of photoresist was deposited on the copper layer and baked hard. A portion of the photoresist layer was exposed to ruby laser radiation through a hole in a removable stainless steel mask. The laser beam had an effective diameter of about 3 millimeters, and the hole in the mask had a diameter of about 40 microns. The portion of the photoresist struck by the laser was effectively decomposed into volatile parts, and so no resolidification occurred. The copper effectively stopped the etch, but was somewhat deformed by the high energy of the ruby laser radiation.

Scanning Techniques

It has been found to be advantageous in some cases to scan the workpiece under laser irradiation. Hence, the workpiece scans, for example, horizontally for a selected number of times for each vertical location (where horizontal and vertical describe X and Y locations in a working plane). This minimizes heat build up while providing statistically even irradiation on a given workpiece.

A pulsed $CO_2$ laser with cylindrical beam is preferred. The focused cylindrical beam aids in mixing of laser modes as will yield a homogenized beam by compressing the modes in such a manner as to mix the modes. Each scan may be comprised of a series of overlapping beam projections for greater uniformity of illumination. Hence, we can avoid uneven etching of alumina and can prevent damage to the mask and stop layer.

For example, we successfully opened bonding pads in alumina approximately 30 $\mu$ thick using a $CO_2$ laser and a methylene chloride bath. In that case, the following laser parameters were found to yield desirable results: 5 joules per pulse, fluence at about 5.5 $j/cm^2$, pulse rate of about 4 hertz, 20 scans per address, and scan rate of about 0.6 cm/sec. Our laser beam spot area was about 0.9 $cm^2$ and the beam shape was oval. The spot was obtained at the focal point of a cylindrical lens of F. L. 12 cm. After every set of 20 scans the beam spot was shifted by 0.35 cm so as to insure overlap of the irradiated areas, the length of the beam spot was about 2 cm. The total scan time for working on a full three inch diameter wafer was about two hours and 50 minutes. These conditions led to complete removal of alumina without requiring further etching, chemical or otherwise. In such case, wire bonding can proceed directly on the exposed pad surfaces.

We move the workpiece through the pulsed and already homogenized laser spot in a manner so as to achieve statistically uniform intensity over the entire surface to be etched. This will be appreciated with reference to FIG. 2. The workpiece first scans horizontally along the x-axis having the pulsed laser spot impinge upon the workpiece at vertical address A (on the y-axis). The workpiece is then incremented to the next address.

Figure 2:
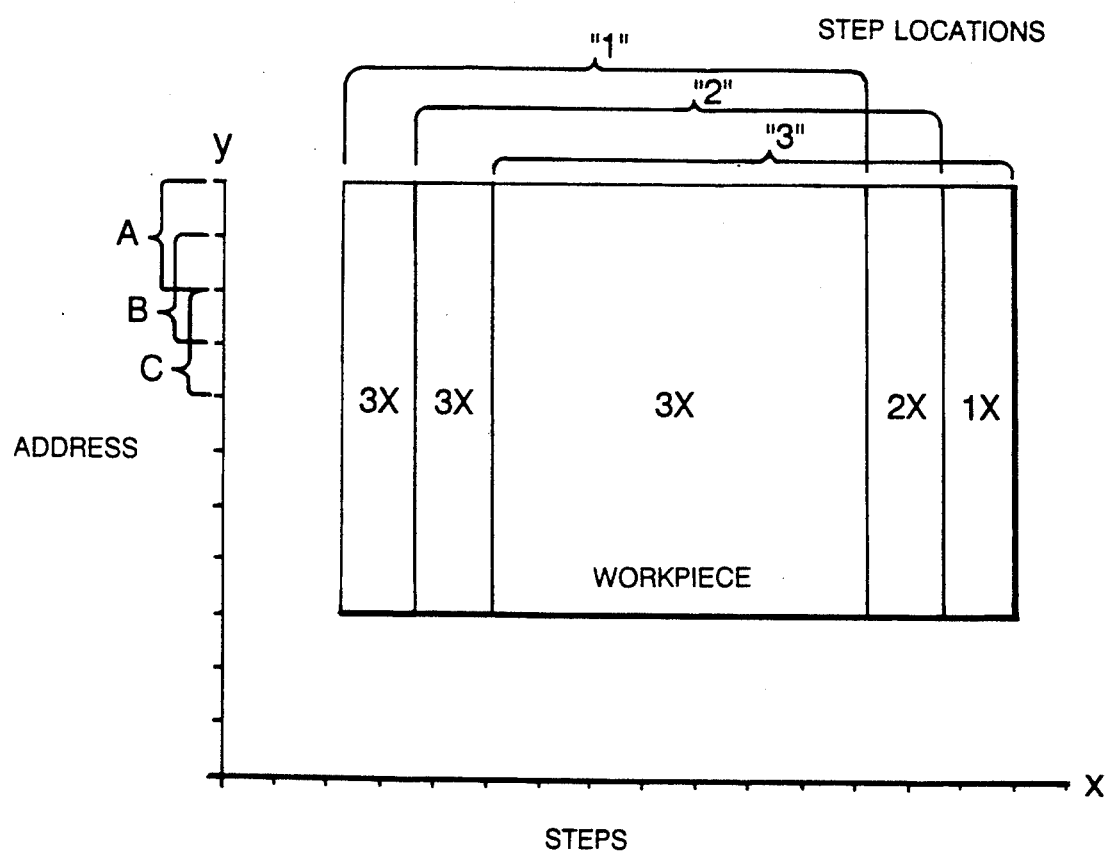
FIG. 2 depicts a scanning pattern in accordance with the invention.

These horizontal scans are performed in steps or increments, along the x-axis. For example, in one set of scans, the workpiece is moved to the step "1" location, the laser is pulsed, the workpiece is moved to the step "2" location, the laser is pulsed, the workpiece is moved to the step "3" location, the laser is pulsed, and etc., until a full scan of the entire workpiece at address A is completed. In this process, the irradiated areas overlap along the x-axis. Hence it will be appreciated that FIG. 2 shows an incompletely scanned workpiece with areas that have been fully overlapped (3 ×) and partly overlapped (2 ×) and (1 ×), in a one-third overlap process, as an example, along address A. After a horizontal scan is completed, it is preferably repeated another 19 times. When this set of 20 scans is complete, the workpiece is incremented to vertical address B, whereupon a second set of scans is performed 20 times. The same occurs at address C, etc. Preferably vertical addresses A, B, C, are selected to achieve a one-third overlap of scan sets. Horizontal overlap can be controlled by scan speed of the workpiece and vertical overlap by increment size, for a given pulse rate and spot size.

In addition, we were able to reduce scan time by designing the scan excursion in view of the outer dimensions of the workpiece. Hence, a workpiece can be scanned with a correspondingly designed or limited scan excursion.

The foregoing description has been limited to specific embodiments of this invention. It will be understood, however, that variations and modifications may be made to the process, with the attainment of some or all of the advantages of the invention. Therefore, it is the object of the appended claims to cover all such variations and modifications as come within the spirit and scope of the invention.

We claim:

1. A process of etching a pattern in a workpiece by applying laser radiation through a mask having an opening that defines said pattern, the mask being made from a material that is reflective at the wavelengths of the laser to prevent the portions of the workpiece covered by said mask from being etched by the laser radiation, comprising the steps of:

applying the laser radiation in a plurality of sets of scans, each one of said sets of scans including producing relative motion between said workpiece and said laser radiation to cause said laser radiation to repeatedly trace a path across an assigned area of said workpiece a selected number of times before another area of said workpiece is scanned in another one of said sets of scans, and performing successive ones of said sets of scans so that said laser radiation applied in adjacent ones of said sets of scans overlaps.

2. The process of claim 1 further comprising performing said successive sets of scans so that said overlap is approximately one-third of a width of each of said sets.

3. The process of claim 2 wherein said scanning comprises applying the laser radiation in a straight line excursion to the outer dimensions of the workpiece.

4. The process of claim 3 further comprising pulsing the laser radiation during the application thereof.

5. The process of claim 4 further comprising pulsing the laser radiation at 4 hertz, using a laser power of 5 joules per pulse and fluence of 5.5 j/cm$^2$, and performing said scanning at a rate of 0.6 cm/sec.

6. The process of claim 1 further comprising providing a liquid layer over the surface of the mask and selecting the laser and the liquid such that the liquid is substantially transparent to wavelengths of the laser radiation.

7. The process of claim 1 wherein said selected number of times in each of said sets is 20.

8. The process of claim 1 further comprising the steps of:

a. providing a liquid layer of methylene chloride, or potassium hydroxide, or dilute nitric aid with small amounts of potassium dichromate, over the surface of the mask, and b. selecting the laser so that the liquid is substantially transparent to the radiation of the laser, the materials forming the workpiece being substantially non-reactive with the liquid at room temperature, and the liquid at elevated temperatures produced by the laser radiation being reactive to the radiation-exposed etch materials of the workpiece.

9. The process of claim 8 further comprising using methylene chloride as said liquid when said laser is of the $CO_2$ type.

10. The process of claim 8 further comprising using potassium hydroxide in water as said liquid when the laser is of the ruby or Nd:YAG type.

11. The process of claim 8 further comprising using dilute nitric acid with small amounts of potassium dichromate as said liquid when the laser is of the krypton fluoride type.

12. The process of claim 8 further comprising pulsing the laser radiation during the application thereof.

13. The method of claim 1 further comprising producing said relative motion by moving said workpiece with respect to said laser radiation.

14. A process for etching a workpiece, under a pulsed laser beam, comprising the steps of:

(a) configuring the laser beam as a cylindrical beam (b) scanning the workpiece in a number of sets of scans, each set being performed by:

(i) pulsing the beam on the workpiece at a first location to form a first etch profile, (ii) producing relative movement between the workpiece and said laser beam in a selected direction and pulsing the laser to form at a second location a second etch profile that overlaps with the first etch profile, (iii) repeating step (ii) and a sufficient number of times to etch the breadth of the workpiece in a strip defined along the selected direction, and (iv) repeating steps (ii) and (iii) a selected number of times for said strip before performing another one of said sets of scans to produce another one of said strips; and (c) performing successive ones of said sets of scans so adjacent ones of said strips overlap in a second direction.

15. The process of claim 14 further comprising selecting a scan speed and a laser pulse rate to adjust the overlap of said etch profiles.

16. The process of claim 14 further comprising performing said successive sets of scans so that said overlap in said second direction is approximately one third of a width of each of said sets.

17. The method of claim 14 further comprising producing said relative movement by moving said workpiece with respect to said laser beam.

18. The method of claim 14 further comprising applying said laser beam through a mask having an opening that defines a pattern to be etched, the mask being made from a material that is reflective at the wavelengths of the laser beam to prevent the portions of the workpiece covered by said mask from being etched by the laser beam.

19. The method of claim 14 further comprising providing a layer of liquid over the surface of the workpiece, the liquid being selected to be substantially transparent to the radiation of the laser and substantially non-reactive with the material forming the workpiece at room temperature, and reactive to said material forming the workpiece at elevated temperatures produced by said laser radiation.

20. The method of claim 14 further comprising providing a laser-reflective etch stop layer at a predetermined depth within the workpiece to limit the depth of said etching.

* * * * *